(12) United States Patent
Kato et al.

(10) Patent No.: US 12,513,934 B2
(45) Date of Patent: Dec. 30, 2025

(54) SEMICONDUCTOR DEVICE

(71) Applicant: KABUSHIKI KAISHA TOSHIBA, Tokyo (JP)

(72) Inventors: Daimotsu Kato, Kawasaki Kanagawa (JP); Hiroshi Ono, Tokyo (JP); Tatsuo Shimizu, Tokyo (JP); Yosuke Kajiwara, Yokohama Kanagawa (JP); Aya Shindome, Yokohama Kanagawa (JP); Akira Mukai, Kawasaki Kanagawa (JP); Po-Chin Huang, Tokyo (JP); Masahiko Kuraguchi, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 988 days.

(21) Appl. No.: 17/576,840

(22) Filed: Jan. 14, 2022

(65) Prior Publication Data

US 2022/0140125 A1    May 5, 2022

Related U.S. Application Data (63) Continuation-in-part of application No. 17/444,977, filed on Aug. 12, 2021, now abandoned.

(30) Foreign Application Priority Data

Oct. 26, 2020  (JP) .................................. 2020-178913
Jul. 5, 2021  (JP) .................................. 2021-111287

(51) Int. Cl.
*H10D 62/824*    (2025.01)
*H10D 30/47*    (2025.01)
(Continued)

(52) U.S. Cl.
CPC ......... *H10D 30/475* (2025.01); *H10D 62/824* (2025.01); *H10D 62/8503* (2025.01); *H10D 64/685* (2025.01); *H10D 64/693* (2025.01)

(58) Field of Classification Search
CPC ............... H10D 30/475; H10D 62/824; H10D 62/8503; H10D 64/685
See application file for complete search history.

(56) References Cited

U.S. PATENT DOCUMENTS

2007/0176204 A1  8/2007  Murata et al.
2010/0059761 A1  3/2010  Horii et al.
(Continued)

FOREIGN PATENT DOCUMENTS

JP  2007-227884 A  9/2007
JP  2013-65590 A  4/2013
(Continued)

OTHER PUBLICATIONS

K. Osipov, et al., "Local 2DEG Density Control in Heterostructures of Piezoelectric Materials and Its Application in GaN HEMT Fabrication Technology," IEEE Transactions on Electron Devices, vol. 65, No. 8, pp. 3176-3184 (Aug. 2018).
(Continued)

*Primary Examiner* — Chad M Dicke
*Assistant Examiner* — Valerie N Newton
(74) *Attorney, Agent, or Firm* — Finnegan, Henderson, Farabow, Garrett & Dunner, LLP (57) ABSTRACT

According to one embodiment, a semiconductor device includes first, second and third electrodes, first and second semiconductor layers, a first member, and a first insulating member. The first semiconductor layer includes $Al_{x1}Ga_{1-x1}N$ ($0 \leq x1 < 1$). The first semiconductor layer includes first, second, third, fourth, fifth, and sixth partial regions. The second semiconductor layer includes $Al_{x2}Ga_{1-x2}N$ ($0 < x2 \leq 1$,
(Continued)

x1<x2). The second semiconductor layer includes first and second semiconductor portions. The first insulating member includes a first insulating region and includes a first material. The first insulating region contacts the third partial region and a part of the third electrode. The first member includes a first portion and includes a second material different from the first material. The first portion is between the fourth partial region and an other part of the third electrode.

17 Claims, 9 Drawing Sheets

(51) Int. Cl.
*H10D 62/85* (2025.01)
*H10D 64/68* (2025.01)

(56) References Cited

U.S. PATENT DOCUMENTS

| | | | |
|---|---|---|---|
| 2019/0348531 A1 | 11/2019 | Kimura et al. | |
| 2019/0386127 A1 | 12/2019 | Kato et al. | |
| 2020/0220003 A1* | 7/2020 | Kuraguchi | H10D 30/475 |
| 2020/0295169 A1 | 9/2020 | Kato et al. | |
| 2021/0210627 A1* | 7/2021 | Moens | H10D 30/475 |
| 2021/0226019 A1* | 7/2021 | Takatani | H10D 30/668 |

FOREIGN PATENT DOCUMENTS

| | | |
|---|---|---|
| JP | 2014-45146 A | 3/2014 |
| JP | 2015-119200 A | 6/2015 |
| JP | 6093190 B2 | 3/2017 |
| JP | 6470480 B1 | 2/2019 |
| JP | 2019-201035 A | 11/2019 |
| JP | 2019-220557 A | 12/2019 |
| JP | 2020-17577 A | 1/2020 |
| JP | 2020-150141 A | 9/2020 |

OTHER PUBLICATIONS

A. Ray, et al., "Numerical Simulation of Enhanced-Reliability Filleted-Gate AlGaN/GaN HEMT," J. of Electronic Materials, vol. 49, No. 3, pp. 2018-2031 (2020).

T. Cosnier, et al., "Local Stress Engineering for the Optimization of p-GaN gate HEMTs Power Devices," 2017 Int'l Conf. on Simulation of Semiconductor Processes and Devices (SISPAD), 5 pages (Sep. 2017).

* cited by examiner

SEMICONDUCTOR DEVICE

CROSS-REFERENCE TO RELATED APPLICATIONS

This application is a continuation-in-part of U.S. application Ser. No. 17/444,977, filed Aug. 12, 2021, which is based upon and claims the benefit of priority from Japanese Patent Application No. 2020-178913, filed on Oct. 26, 2020, and Japanese Patent Application No. 2021-111287, filed on Jul. 5, 2021; the entire contents of which are incorporated herein by reference.

FIELD

Embodiments described herein relate generally to a semiconductor device.

BACKGROUND

For example, in a semiconductor device such as a transistor, characteristics are desired to be improved.

DETAILED DESCRIPTION

According to one embodiment, a semiconductor device includes a first electrode, a second electrode, a third electrode, a first semiconductor layer, a second semiconductor layer, a first member, and a first insulating member. A direction from the first electrode to the second electrode is along a first direction. A position of the third electrode in the first direction is between a position of the first electrode in the first direction and a position of the second electrode in the first direction. The first semiconductor layer includes $Al_{x1}Ga_{1-x1}N$ ($0 \le x1 < 1$). The first semiconductor layer includes a first partial region, a second partial region, a third partial region, a fourth partial region, a fifth partial region, and a sixth partial region. A direction from the first partial region to the first electrode, a direction from the second partial region to the second electrode, a direction from the third partial region to a part of the third electrode, and a direction from the fourth partial region to an other part of the third electrode is along a second direction crossing the first direction. The fourth partial region is between the third partial region and the second partial region. A position of the fifth partial region in the first direction is between the position of the first partial region in the first direction and a position of the third partial region in the first direction. A position of the sixth partial region in the first direction is between the position of the fourth partial region in the first direction and the position of the second partial region in the first direction. The second semiconductor layer includes $Al_{x2}Ga_{1-x2}N$ ($0 < x2 \le 1$, $x1 < x2$). The second semiconductor layer includes a first semiconductor portion and a second semiconductor portion. A direction from the fifth partial region to the first semiconductor portion is along the second direction. A direction from the sixth partial region to the second semiconductor portion is along the second direction. The first insulating member includes a first insulating region and includes a first material. The first insulating region is between the third partial region and the part of the third electrode in the second direction and between the fourth partial region and the other part of the third electrode in the second direction. The first insulating region contacts the third partial region and the part of the third electrode. The first member includes a first portion and includes a second material different from the first material. The first portion is between the fourth partial region and the other part of the third electrode.

According to one embodiment, a semiconductor device includes a first electrode, a second electrode, a third electrode, a first semiconductor layer, a second semiconductor layer, a first member, and a first insulating member. A direction from the first electrode to the second electrode is along a first direction. A position of the third electrode in the first direction is between a position of the first electrode in the first direction and a position of the second electrode in the first direction. The first semiconductor layer includes $Al_{x1}Ga_{1-x1}N$ ($0 \le x1 < 1$). The first semiconductor layer includes a first partial region, a second partial region, a third partial region, a fourth partial region, a fifth partial region, and a sixth partial region. A direction from the first partial region to the first electrode, a direction from the second partial region to the second electrode, a direction from the third partial region to a part of the third electrode, and a direction from the fourth partial region to an other part of the third electrode are along a second direction crossing the first direction. The fourth partial region is between the third partial region and the second partial region. A position of the fifth partial region in the first direction is between the position of the first partial region in the first direction and a position of the third partial region in the first direction. A position of the sixth partial region in the first direction is between the position of the fourth partial region in the first direction and the position of the second partial region in the first direction. The second semiconductor layer includes $Al_{x2}Ga_{1-x2}N$ (0<x2≤1, x1<x2). The second semiconductor layer includes a first semiconductor portion and a second semiconductor portion. A direction from the fifth partial region to the first semiconductor portion is along the second direction. A direction from the sixth partial region to the second semiconductor portion is along the second direction. The first insulating member includes a first insulating region. The first insulating region is between the third partial region and the part of the third electrode in the second direction and between the fourth partial region and the other part of the third electrode in the second direction. The first insulating region contacts the third partial region and the part of the third electrode. The first member includes a first portion. The first portion is between the fourth partial region and the other part of the third electrode. The first insulating region has one of a compressive stress and a tensile stress. The first portion has other one of a compressive stress and a tensile stress.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
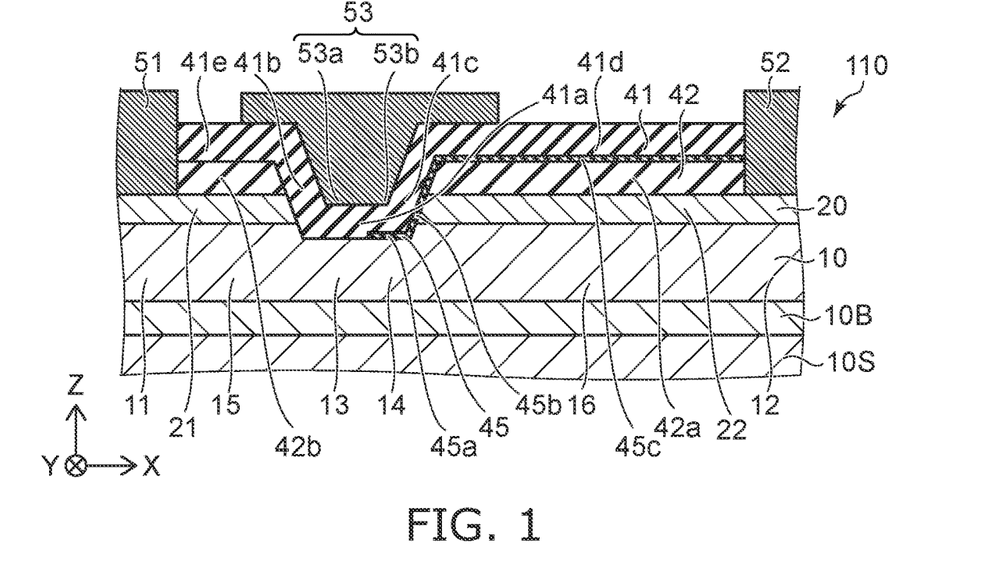
FIG. 1 is a schematic cross-sectional view illustrating a semiconductor device according to a first embodiment.

FIG. 1 is a schematic cross-sectional view illustrating a semiconductor device according to a first embodiment. As shown in FIG. 1, a semiconductor device 110 according to the embodiment includes a first electrode 51, a second electrode 52, a third electrode 53, a first semiconductor layer 10, a second semiconductor layer 20, a first member 45, and a first insulating member 41. In this example, the semiconductor device 110 includes a substrate 10S and a semiconductor layer 10B.

A direction from the first electrode 51 to the second electrode 52 is along the first direction, and the first direction is defined as, for example, an X-axis direction. One direction perpendicular to the X-axis direction is defined as a Z-axis direction. A direction perpendicular to the X-axis direction and the Z-axis direction is defined as a Y-axis direction.

The position of the third electrode 53 in the first direction is between the position of the first electrode 51 in the first direction and the position of the second electrode 52 in the first direction. At least a part of the first to third electrodes 51 to 53 extends along the Y-axis direction, The first semiconductor layer 10 includes $Al_{x1}Ga_{1-x1}N$ (0≤x1<1). The composition ratio x1 of Al in the first semiconductor layer 10 is, for example, not less than 0 and not more than 0.05. The first semiconductor layer 10 includes, for example, GaN.

The first semiconductor layer 10 includes a first partial region 11, a second partial region 12, a third partial region 13, a fourth partial region 14, a fifth partial region 15, and a sixth partial region 16. The direction from the first partial region 11 to the first electrode 51 is along a second direction intersecting a first direction. The second direction is, for example, the Z-axis direction. The direction from the second partial region 12 to the second electrode 52 is along the second direction. The direction from the third partial region 13 to a part 53a of the third electrode 53 is along the second direction. The direction from the fourth partial region 14 to an other part 53b of the third electrode 53 is along the second direction.

The position of the part 53a of the third electrode 53 in the first direction (for example, the X-axis direction) is between the position of the first electrode 51 in the first direction and the position of an other part 53b of the third electrode 53 in the first direction. The position of the third partial region 13 in the first direction (for example, the X-axis direction) is between the position of the first partial region 11 in the first direction and the position of the fourth partial region 14 in the first direction. The fourth partial region 14 is between the third partial region 13 and the second partial region 12.

The position of the fifth partial region 15 in the first direction is between the position of the first partial region 11 in the first direction and the position of the third partial region 13 in the first direction. The position of the sixth partial region 16 in the first direction is between the position of the fourth partial region 14 in the first direction and the position of the second partial region 12 in the first direction.

The second semiconductor layer 20 includes $Al_{x2}Ga_{1-x2}N$ (0<x2≤1, x1<x2). The composition ratio x2 of Al in the second semiconductor layer 20 is, for example, more than 0.05 and not more than 0.8. The second semiconductor layer 20 includes, for example, AlGaN.

The second semiconductor layer 20 includes a first semiconductor portion 21 and a second semiconductor portion 22. The direction from the fifth partial region 15 to the first semiconductor portion 21 is along the second direction (for example, the Z-axis direction). The direction from the sixth partial region 16 to the second semiconductor portion 22 is along the second direction (for example, the Z-axis direction).

For example, the first semiconductor portion 21 is electrically connected to the first electrode 51. For example, the first partial region 11 is electrically connected to the first electrode 51. For example, the second semiconductor portion 22 is electrically connected to the second electrode 52.

The first insulating member 41 includes a first insulating region 41a. The first insulating member 41 includes a first material. The first material includes, for example, silicon and oxygen. The first insulating member 41 includes, for example, silicon oxide. The first insulating member 41 includes, for example, $SiO_2$.

The first insulating region 41a is between the third partial region 13 and the part 53a of the third electrode 53 in the second direction (for example, the Z-axis direction) and between the fourth partial region 14 and the other part 53b of the third electrode 53 in the second direction (for example, the Z-axis direction). The first insulating region 41a is in contact with the third partial region 13 and the part 53a of the third electrode 53.

The first member 45 includes a first portion 45a. The first member 45 includes a second material. The second material is different from the first material. The second material includes, for example, one of a third material, a fourth material and a fifth material. The third material includes aluminum and nitrogen. The fourth material includes silicon and nitrogen. The fifth material includes at least one selected from the group consisting of aluminum and silicon and at least one selected from the group consisting of nitrogen and oxygen.

In one example, the first material includes silicon and oxygen, and the second material includes aluminum and nitrogen. The second material includes AlN. For example, the first semiconductor layer 10 includes crystals. At least a part of the first member 45 includes crystals.

The first portion 45a of the first member 45 is between the fourth partial region 14 and the other part 53b of the third electrode 53. For example, the first portion 45a is in contact with the fourth partial region 14.

The substrate 105 may be, for example, a silicon substrate. The semiconductor layer 10B is provided between the substrate 105 and the first semiconductor layer 10. The semiconductor layer 10B is, for example, a buffer layer. The semiconductor layer 10B includes, for example, a nitride semiconductor. The semiconductor layer 10B includes, for example, Al, Ga and N.

A carrier region is formed on a part of the first semiconductor layer 10 on a side of the second semiconductor layer 20. The carrier region is, for example, a two-dimensional electron gas. The current flowing between the first electrode 51 and the second electrode 52 can be controlled by the potential of the third electrode 53. The first electrode 51 functions as, for example, a source electrode. The second electrode 52 functions as, for example, a drain electrode. The third electrode 53 functions as, for example, a gate electrode. The first insulating member 41 functions as, for example, a gate insulating film. The semiconductor device 110 is, for example, HEMT (High Electron Mobility Transistor).

As shown in FIG. 1, at least a part of the third electrode 53 is between the first semiconductor portion 21 and the second semiconductor portion 22 in the first direction (X-axis direction). At least a part of the third electrode 53 is between the fifth partial region 15 and the sixth partial region 16 in the first direction (X-axis direction). With such a configuration, for example, the threshold voltage can be increased. For example, it becomes easier to obtain the characteristics of normally on.

In the embodiment, for example, the first member 45 including a material different from the first insulating member 41 is provided in a part between the first semiconductor layer 10 and the third electrode 53. As a result, the on-resistance can be lowered. For example, a high threshold is obtained and a low on-resistance is obtained. According to the embodiment, a semiconductor device which is possible to improve the characteristics is provided.

For example, it is considered that a carrier region (for example, a two-dimensional electron gas) is locally formed in a portion of the first member 45 where the first portion 45a is provided. No carrier region is formed in the region where the first portion 45a is not provided. The carrier region is not provided as a whole between the first electrode 51 and the second electrode 52. Therefore, a high threshold value can be obtained. The carrier region based on the first portion 45a of the first member 45 provides a low on-resistance.

As shown in FIG. 1, the first insulating member 41 includes a second insulating region 41b and a third insulating region 41c, The second insulating region 41b is between the first semiconductor portion 21 and the third electrode 53 in the first direction (X-axis direction). The third insulating region 41c is between the third electrode 53 and the second semiconductor portion 22 in the first direction (X-axis direction). Good insulation can be obtained.

In this example, the first member 45 further includes a second portion 45b. The second portion 45b is between the third insulating region 41c and the second semiconductor portion 22. For example, the second portion 45b may be in contact with the first portion 45a.

In this example, the first member 45 further includes a third portion 45c. The second semiconductor portion 22 is between the sixth partial region 16 and the third portion 45c.

For example, the first insulating member 41 includes a fourth insulating region 41d. The third portion 45c is between the second semiconductor portion 22 and the fourth insulating region 41d.

In this example, the semiconductor device 110 further includes a second insulating member 42. The second insulating member 42 includes silicon and nitrogen. The second insulating member 42 includes, for example, SiN (for example, $Si_3N_4$). The second insulating member 42 includes a first insulating portion 42a. The first insulating portion 42a is between the second semiconductor portion 22 and the third portion 45c.

As shown in FIG. 1, the first insulating member 41 may include a fifth insulating region 41e. The first semiconductor portion 21 is provided between the fifth partial region 15 and the fifth insulating region 41e. The second insulating member 42 may include the second insulating portion 42b. The second insulating portion 42b is between the first semiconductor portion 21 and the fifth insulating region 41e.

Figure 2:
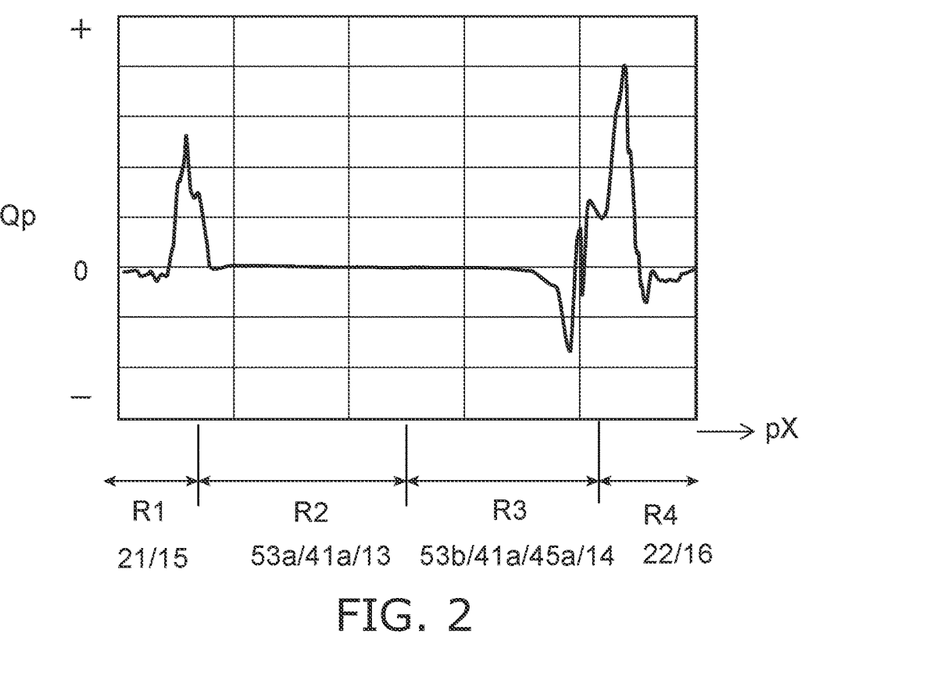
FIG. 2 is a graph view illustrating characteristics of the semiconductor device according to the first embodiment.

FIG. 2 is a graph view illustrating the characteristics of the semiconductor device according to the first embodiment.

FIG. 2 shows an example of a simulation result of the characteristics of the semiconductor device 110. The horizontal axis of FIG. 2 is a position pX along the X-axis direction. The vertical axis is a piezo charge density Qp. In FIG. 2, the first to fourth regions R1 to R4 are shown. The first region R1 is a region where the fifth partial region 15 and the first semiconductor portion 21 are provided. The second region R2 is a region where the first insulating region 41a is in contact with the third partial region 13 and the part 53a of the third electrode 53. The third region R3 is a portion where the first portion 45a of the first member 45 is provided. The fourth region R4 is a region where the sixth partial region 16 and the second semiconductor portion 22 are provided.

As shown in FIG. 2, a positive piezo charge is generated in the portion of the first region R1 on a side of the second region R2. Negative piezo charges and positive piezo charges are generated in the vicinity between the third region R3 and the fourth region R4.

The positive piezo charge generated in the first region R1 changes the conduction band, for example, causing carriers. It is considered that the conduction band is changed by the negative piezo charge and the positive piezo charge generated in the vicinity between the third region R3 and the fourth region R4, and for example, carriers are locally generated.

As described above, in the semiconductor device 110 according to the embodiment, a high threshold voltage and a low on-resistance can be obtained. For example, in the second region R2, no carrier region is generated. As a result, it is considered that a high threshold value is obtained. On the other hand, in the third region R3, it is considered that a carrier region is locally generated. High threshold and low on-resistance are obtained.

For example, in a first reference example in which the first member 45 is not provided, an on-resistance is high. On the other hand, in a second reference example in which the first member 45 is provided as a whole between the first semiconductor layer 10 and the first insulating member 41, the threshold voltage is low. In the second reference example, for example, a normally on operation is performed. In the embodiment, a high threshold and a low on-resistance can be obtained.

The semiconductor device 110 illustrated in FIG. 1 is obtained, for example, by, after providing a film to be the first member 45 on the entire semiconductor layer, removing a part of the film, and further forming the first insulating member 41 and the third electrode 53. Alternatively, it may be obtained by forming the film to be the first member 45 on a part of the semiconductor layer by a method such as lift-off, and further forming the first insulating member 41 and the third electrode 53.

As shown in FIG. 1, the distance between the first electrode 51 and the third electrode 53 along the first direction (X-axis direction) is shorter than the distance between the third electrode 53 and the second electrode 52 along the first direction. Stable operation can be obtained.

In the embodiment, the first member 45 may be provided on the drain electrode side. In the embodiment, the first member 45 may be provided on the source electrode side.

Figure 3:
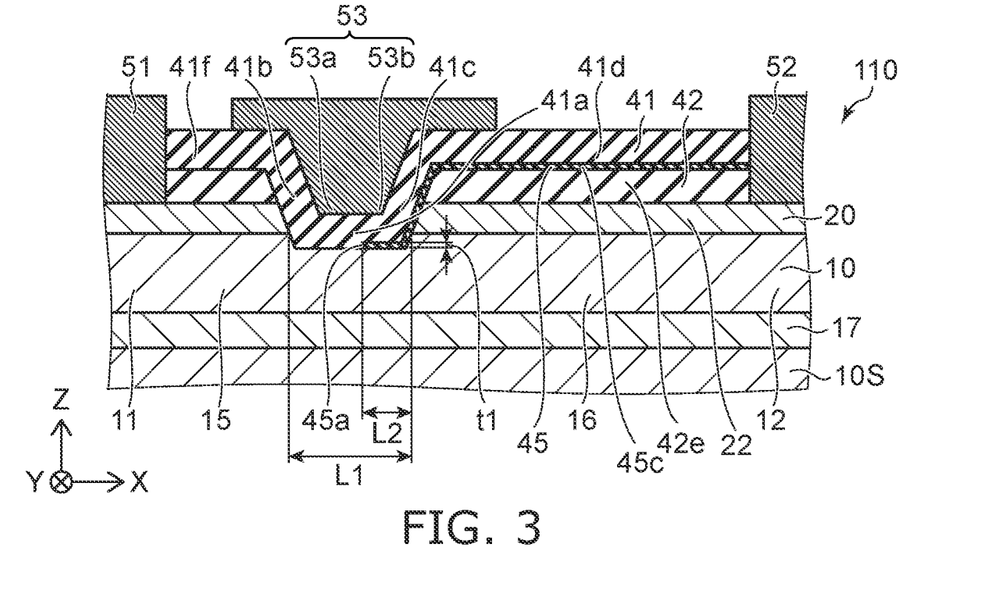
FIG. 3 is a schematic cross-sectional view illustrating the semiconductor device according to the first embodiment.

FIG. 3 is a schematic cross-sectional view illustrating the semiconductor device according to the first embodiment.

As shown in FIG. 3, the thickness of the first portion 45a along the second direction (Z-axis direction) is defined as the thickness ti. In the embodiment, the thickness ti is preferably, for example, not less than 0.2 nm and not more than 5 nm. When the thickness t1 is not less than 0.2 nm, for example, the low on-resistance can be stably obtained. When the thickness t1 is not more than 5 nm, for example, the high threshold value can be stably obtained. The thickness t1 may be not more than 10 nm.

As shown in FIG. 3, the length of the first insulation region 41a along the first direction (X-axis direction) is defined as the length L1. The length of the first portion 45a along the first direction (X-axis direction) is defined as the length L2. The length L2 may be not less than 0.05 times and not more than 0.9 times the length L1. The length L2 may be not more than 0.5 times the length L1. For example, it may be not more than 0.3 times the length L1.

For example, the first portion 45a may be provided between the first semiconductor layer 10 and an end portion of the first insulating region 41a on a side of the second electrode 52. As a result, a local carrier region can be stably obtained.

The semiconductor device 110 illustrated in FIG. 1 is obtained, for example, by, after providing a film to be the first member 45 on the entire semiconductor layer, removing a part of the film, and further forming the first insulating member 41 and the third electrode 53. It is obtained by forming. The semiconductor device 110 may be obtained by another method.

Figure 4:
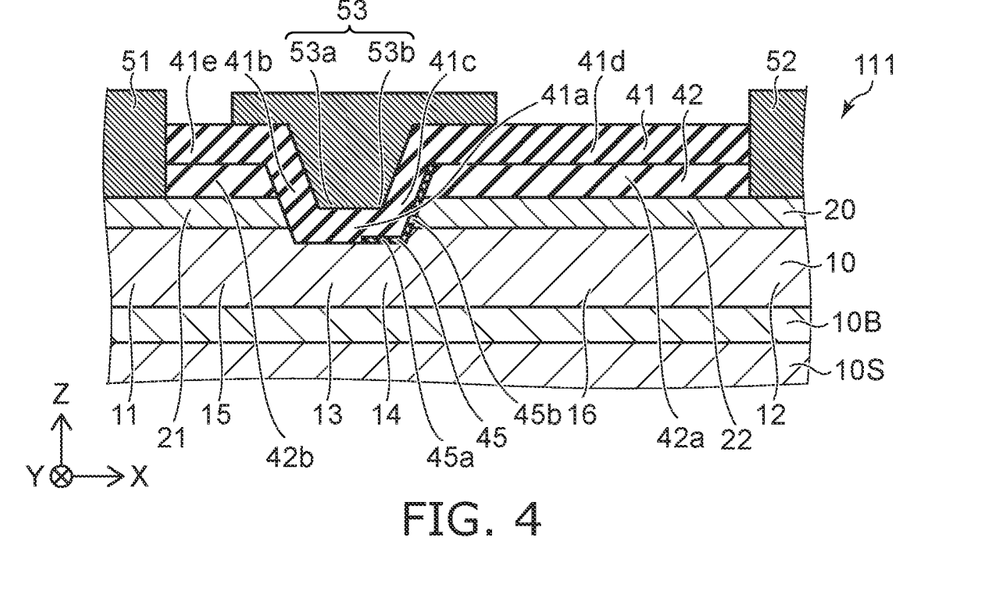
FIG. 4 is a schematic cross-sectional view illustrating a semiconductor device according to the first embodiment.
Figure 5:
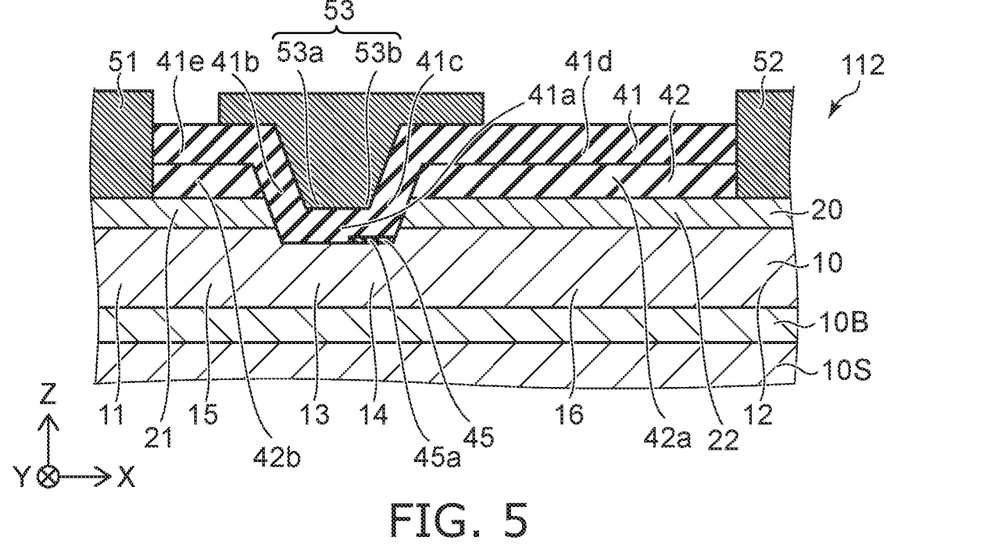
FIG. 5 is a schematic cross-sectional view illustrating a semiconductor device according to the first embodiment.

FIGS. 4 and 5 are schematic cross-sectional views illustrating semiconductor devices according to the first embodiment.

As shown in FIG. 4, in a semiconductor device 111, the third portion 45c is omitted. As shown in FIG. 5, in a semiconductor device 112, the second portion 45b and the third portion 45c are omitted. Also in the semiconductor devices 111 and 112, for example, a high threshold voltage and a low on-resistance can be obtained.

Second Embodiment

Figure 6:
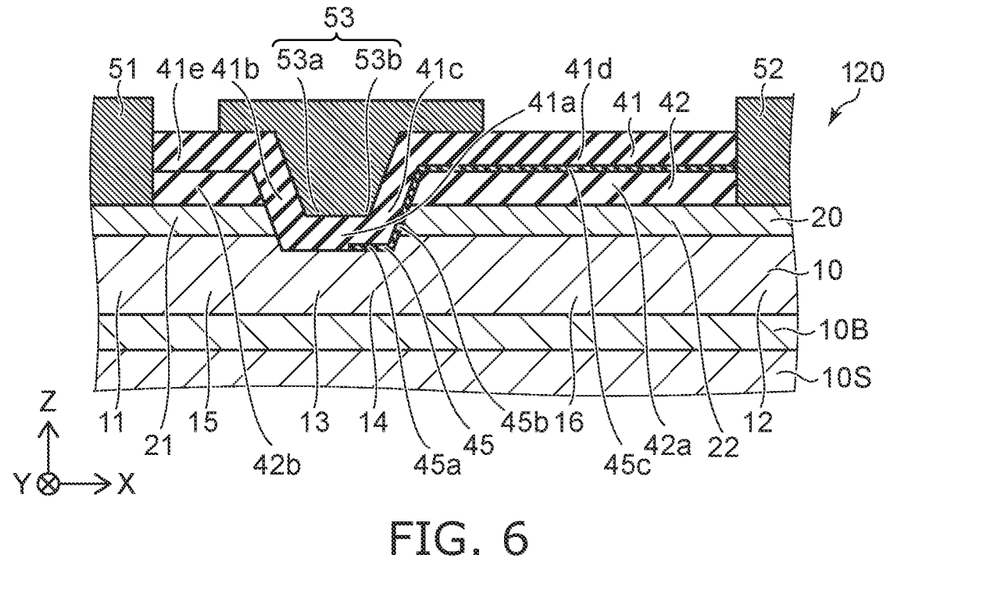
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, also in the semiconductor device 120 according to the embodiment, the first electrode 51, the second electrode 52, the third electrode 53, the first semiconductor layer 10, the second semiconductor layer 20, the first member 45, and the insulating member 41 are provided.

In the semiconductor device 120, the configurations of the first electrode 51, the second electrode 52, the third electrode 53, the first semiconductor layer 10, the second semiconductor layer 20, and the first insulating member 41 may be the same as those in the semiconductor device 110.

For example, the first insulating member 41 includes the first insulating region 41a. The first insulating region 41a is between the third partial region 13 and a part of the third electrode 53 in the second direction (Z-axis direction), and is between the four partial region 14 and an other part 53b of the third electrode 53 in the second direction (Z-axis direction). The first insulating region 41a is in contact with the third partial region 13 and the part 53a of the third electrode 53. The first portion 45a of the first member 45 is between the fourth partial region 14 and the other part 53b of the third electrode 53. In the semiconductor device 120, the material of the first member 45 may be the same as that of the first insulating member 41.

In the semiconductor device 120, the first insulating region 41a has one of compressive stress and tensile stress. The first portion 45a has the other of compressive stress and tensile stress. As a result, the polarities of stress differ between the region where the first portion 45a is provided and the region where the first portion 45a is not provided. As a result, the carrier region can be locally formed. Also in the semiconductor device 120, a high threshold voltage and a low on-resistance can be obtained.

For example, even when the first insulating member 41 and the first member 45 include the same material, the formation conditions of the first insulating member 41 and the formation conditions of the first member 45 are different from each other. As a result, the stress can be changed.

The configuration described with respect to the first embodiment can be applied to the second embodiment. In the second embodiment, the second portion 45b or the third portion 45c may be omitted.

Third Embodiment

Figure 7:
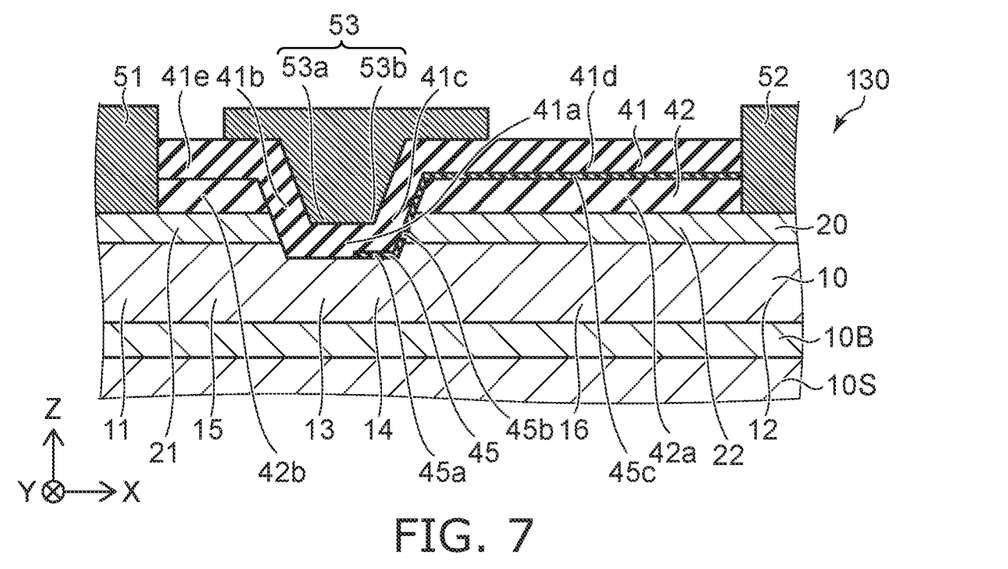
FIG. 7 is a schematic cross-sectional view illustrating a semiconductor device according to a third embodiment.

FIG. 7 is a schematic cross-sectional view illustrating a semiconductor device according to a third embodiment.

As shown in FIG. 7, a semiconductor device 130 according to the embodiment includes the first electrode 51, the second electrode 52, the third electrode 53, the first semiconductor layer 10, the second semiconductor layer 20, the first member 45, and the first insulating member 41. In the semiconductor device 130, the first member 45 includes $Al_{z1}Ga_{1-z1}N$ (0<z1≤1, x1<z1). Other configurations of the semiconductor device 130 may be the same as the configurations of the semiconductor device according to the first embodiment or the second embodiment.

In the semiconductor device 130, the first member 45 includes AlGaN. The first member 45 includes the first portion 45a. The first portion 45a is between the fourth partial region 14 and the other part 53b of the third electrode 53 described above. By providing the first portion 45a, for example, the threshold voltage can be increased in the region where the first portion 45a is provided. For example, it becomes easier to obtain the characteristics of normally on.

In the semiconductor device 130, the first member 45 is provided in a part between the first semiconductor layer 10 and the third electrode 53. As a result, the on-resistance can be lowered. For example, a high threshold is obtained and a low on-resistance is obtained. According to the embodiment, a semiconductor device which is possible to improve the characteristics is provided.

In the semiconductor device 130, the composition ratio z1 of Al in the first member 45 may be lower than the composition ratio x2 of Al in the second semiconductor layer 20. The composition ratio z1 is, for example, more than 0 and 0.2 or less.

In the semiconductor device 130, at least a part of the first insulation region 41a is between the fifth partial region 15 and the sixth partial region 16 in the first direction (X-axis direction). The semiconductor device 130 is, for example, a recess gate type semiconductor device. For example, at least a part of the third electrode 53 may be provided between the first semiconductor portion 21 and the second semiconductor portion 22 in the first direction.

In the semiconductor device 130, the first insulating member 41 may include the second insulating region 41b and the third insulating region 41c. The second insulating region 41b is between the first semiconductor portion 21 and the third electrode 53 in the first direction. The third insulating region 41c is between the third electrode 53 and the second semiconductor portion 22 in the first direction.

In the semiconductor device 130, the first member 45 may further include the second portion 45b. The second portion 45b is between the third insulating region 41c and the second semiconductor portion 22. The second portion 45b may contacts the first portion 45a.

In the semiconductor device 130, the first member 45 may further include the third portion 45c. The second semiconductor portion 22 is between the sixth portion region 16 and the third portion 45c. The first insulating member 41 may include the fourth insulating region 41d. The third portion 45c is between the second semiconductor portion 22 and the fourth insulating region 41d.

The semiconductor device 130 may further include the second insulating member 42. The second insulating member 42 includes silicon and nitrogen. The second insulating member 42 includes the first insulating portion 42a. The first insulating portion 42a is between the second semiconductor portion 22 and the third portion 45c. The first insulating member 41 may include the fifth insulating region 41e. The first semiconductor portion 21 is provided between the fifth partial region 15 and the fifth insulating region 41e. The second insulating member 42 may include the second insulating portion 42b. The second insulating portion 42b is between the first semiconductor portion 21 and the fifth insulating region 41e.

Figure 8:
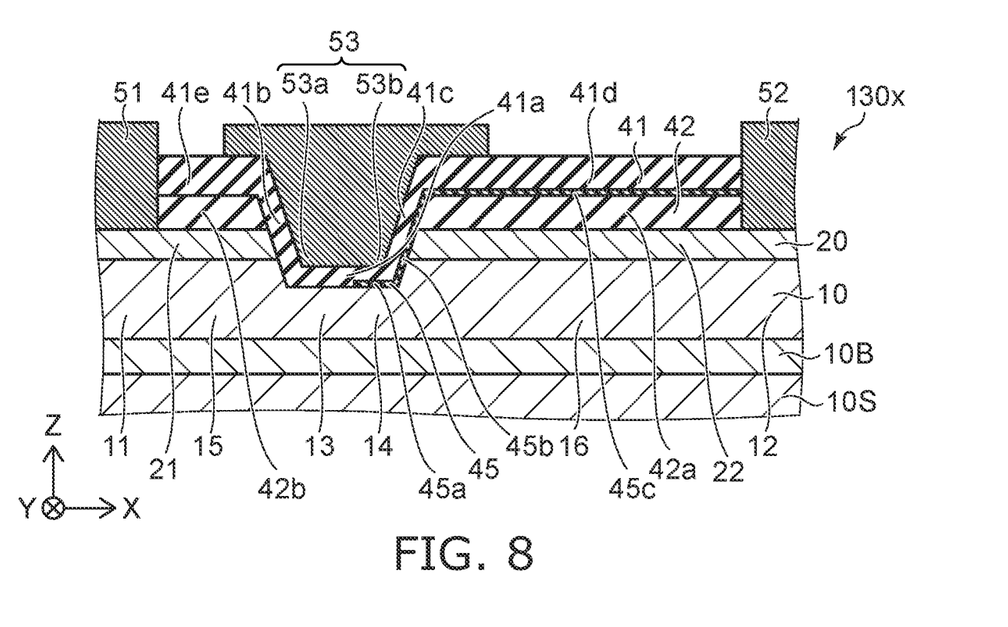
FIG. 8 is a schematic cross-sectional view illustrating a semiconductor device according to the third embodiment.

FIG. 8 is a schematic cross-sectional view illustrating a semiconductor device according to the embodiment.

As shown in FIG. 8, in a semiconductor device 130x according to the embodiment, at least a part of the third electrode 53 is between the fifth partial region 15 and the sixth partial region 16 in the first direction (X-axis direction). Other configurations of the semiconductor device 130x may be the same as the configuration of the semiconductor device 130. Also in the semiconductor device 130x, for example, a high threshold value can be obtained and a low on-resistance can be obtained.

Figure 9:
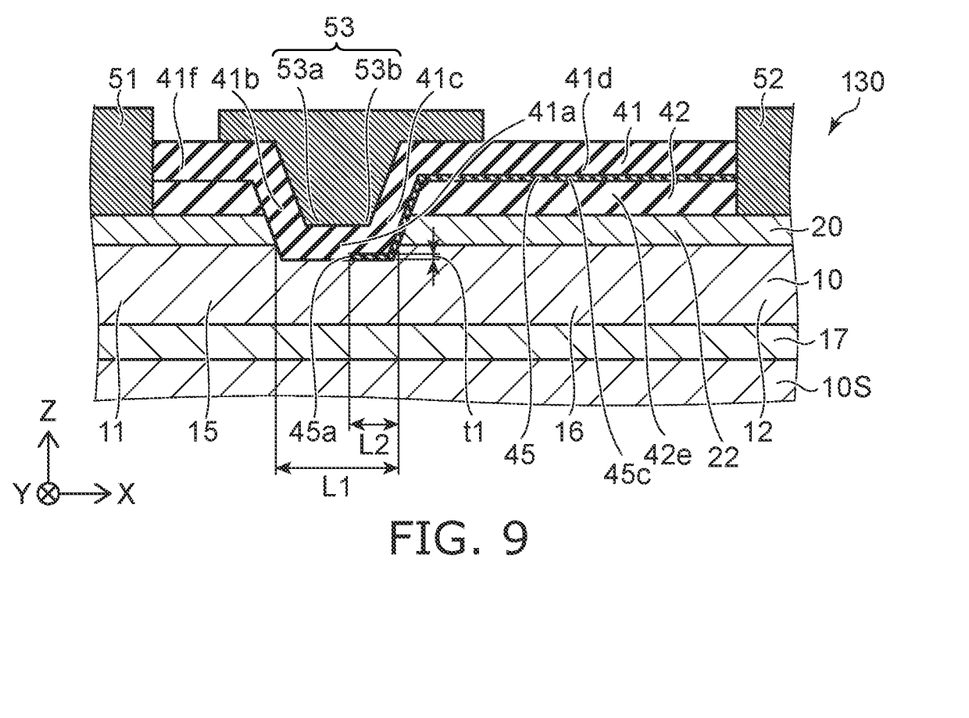
FIG. 9 is a schematic cross-sectional view illustrating the semiconductor device according to the third embodiment.

FIG. 9 is a schematic cross-sectional view illustrating the semiconductor device according to the third embodiment.

As shown in FIG. 9, in the semiconductor device 130, the thickness of the first portion 45a along the second direction (Z-axis direction) is taken as a thickness t1. In the semiconductor device 130, the thickness t1 is preferably, for example, not less than 0.2 nm and not more than 5 nm. Since the thickness ti is not less than 0.2 nm, for example, low on-resistance can be stably obtained. Since the thickness t1 is not more than 5 nm, for example, a high threshold value can be stably obtained. Traps can be suppressed when the thickness t1 is not more than 5 nm. The thickness t1 may be not more than 10 nm.

As shown in FIG. 9, the length of the first insulation region 41a along the first direction (X-axis direction) is taken as a length L1. The length of the first portion 45a along the first direction (X-axis direction) is taken as a length L2. The length L2 may be not less than 0.05 times and not more than 0.9 times the length L1. The length L2 may be not more than 0.5 times the length L1. For example, it may be not more than 0.3 times the length L1.

Figure 10:
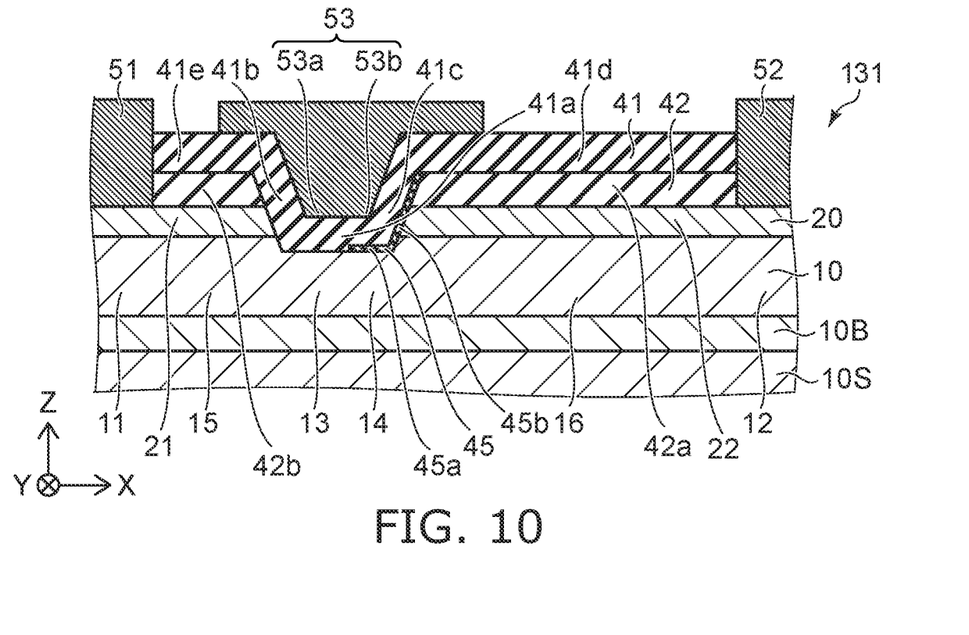
FIG. 10 is a schematic cross-sectional view illustrating a semiconductor device according to the third embodiment.
Figure 11:
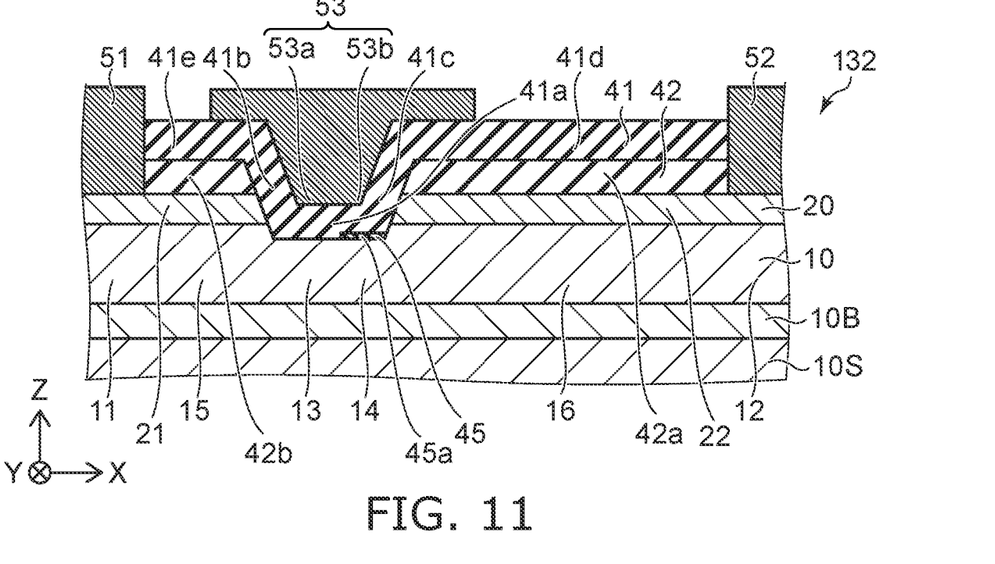
FIG. 11 is a schematic cross-sectional view illustrating a semiconductor device according to the third embodiment.

FIGS. 10 and 11 are schematic cross-sectional views illustrating semiconductor devices according to the third embodiment.

As shown in FIG. 10, in the semiconductor device 131, the third portion 45c is omitted. As shown in FIG. 11, in the semiconductor device 132, the second portion 45b and the third portion 45c are omitted. Except for these, the configurations of the semiconductor devices 131 and 132 may be the same as the configurations of the semiconductor device 130 or the semiconductor device 130x. Also in the semiconductor devices 131 and 132, for example, a high threshold voltage and a low on-resistance can be obtained.

Figure 12:
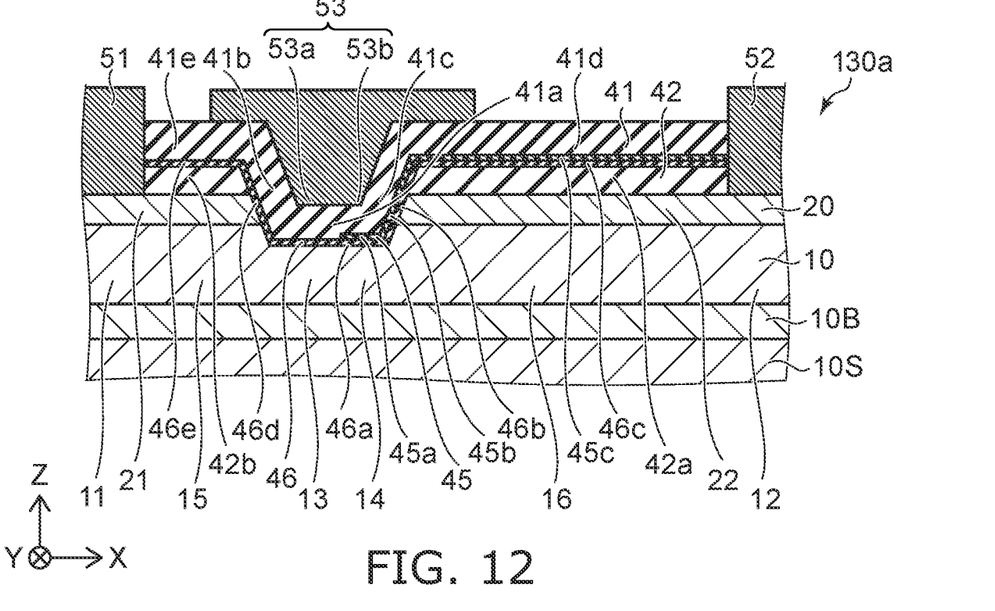
FIG. 12 is a schematic cross-sectional view illustrating a semiconductor device according to the third embodiment.

FIG. 12 is a schematic cross-sectional view illustrating a semiconductor device according to the third embodiment.

As shown in FIG. 12, a semiconductor device 130a according to the embodiment includes a nitride member 46. The nitride member 46 includes $Al_{z2}Ga_{1-z2}N$ ($0<z2\leq1$, $x2<z2$). The nitride member 46 may be, for example, AlN. The nitride member 46 includes a first nitride region 46a. At least a part of the first nitride region 46a is between the third partial region 13 and a part of the first insulating region 41a, and between the fourth partial region 14 and the first portion 45a.

The nitride member 46 may include a second nitride region 46b. At least a part of the nitride member 46 (second nitride region 46b) is between the second portion 45b and the second semiconductor portion 22 in the first direction (X-axis direction).

The nitride member 46 may include a third nitride region 46c. At least a part of the nitride member 46 (third nitride region 46c) is between the second semiconductor portion 22 and the third portion 45c in the second direction (Z-axis direction).

The nitride member 46 may include a fourth nitride region 46d. At least a part of the nitride member 46 (fourth nitride region 46d) is between the first semiconductor portion 21 and the second insulating region 41b in the first direction (X-axis direction).

The nitride member 46 may include a fifth nitride region 46e. The first semiconductor portion 21 is between the fifth portion region 15 and the fifth nitride region 46e.

By providing the nitride region 46, for example, high electron mobility can be easily obtained at the bottom of the recess and the side of the recess. The nitride region 46 suppresses the intrusion of impurities from, for example, the semiconductor layer or the first insulating member 41. For example, high reliability can be easily obtained.

Figure 13:
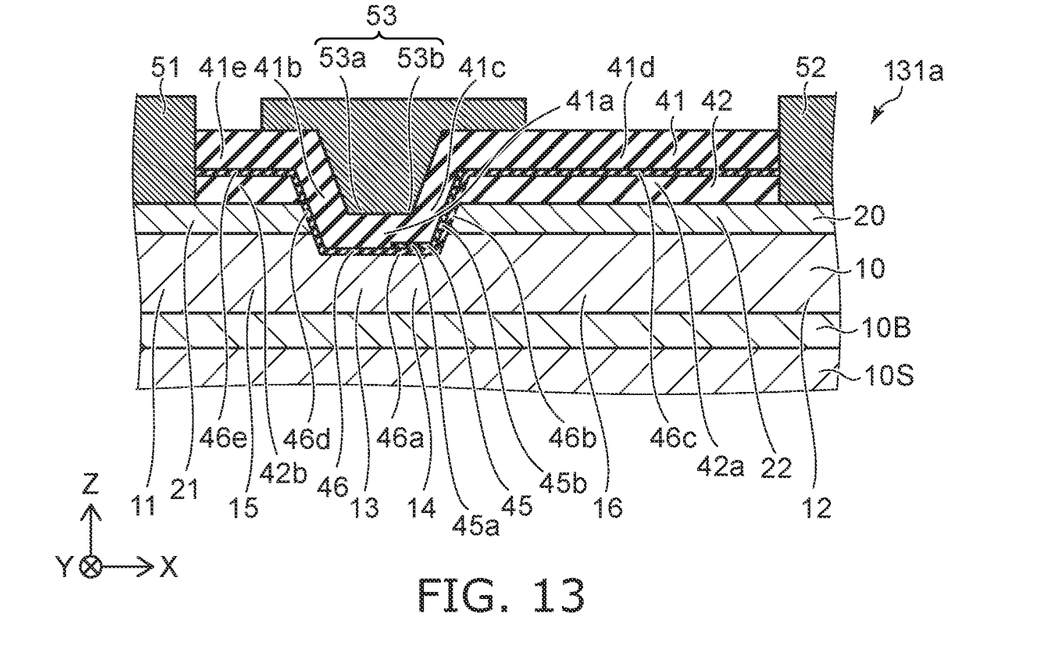
FIG. 13 is a schematic cross-sectional view illustrating a semiconductor device according to the third embodiment.
Figure 14:
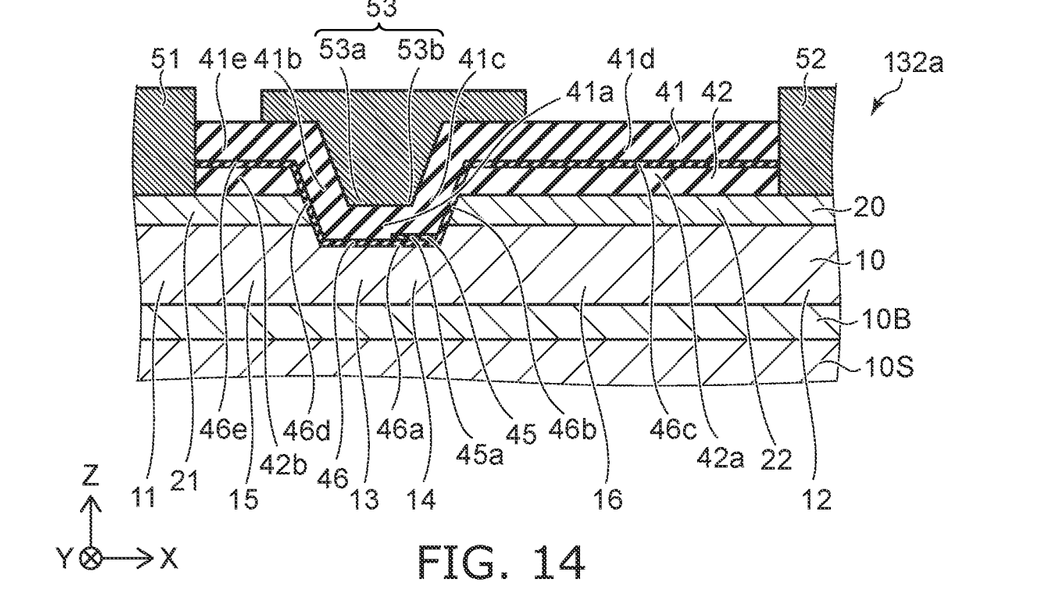
FIG. 14 is a schematic cross-sectional view illustrating a semiconductor device according to the third embodiment.

FIGS. 13 and 14 are schematic cross-sectional views illustrating semiconductor devices according to the third embodiment.

As shown in FIGS. 13 and 14, semiconductor devices 131a and 132a include a nitride member 46. Other configurations of the semiconductor devices 131a and 132a may be the same as those of the semiconductor devices 131 and 132.

The second insulating member 42 may be provided in the semiconductor devices 130a, 131a and 132a. The third nitride region 46c of the nitride member 46 is provided, for example, on the first insulating portion 42a of the second insulating member 42. The first insulating portion 42a is between the second semiconductor portion 22 and the third nitride region 46c. The fifth nitride region 46e of the nitride member 46 is provided, for example, on the second insulating portion 42b of the second insulating member 42. The second insulating portion 42b is between the first semiconductor portion 21 and the fifth nitride region 46e. At least one of the third nitride region 46c or the fifth nitride region 46e may be amorphous. At least one of the first nitride region 46a, the second nitride region 46b, or the fourth nitride region 46d includes crystals. For example, the crystallinity in at least one of the third nitride region 46c or the fifth nitride region 46e is lower than the crystallinity in the first nitride region 46a.

Fourth Embodiment

Figure 15:
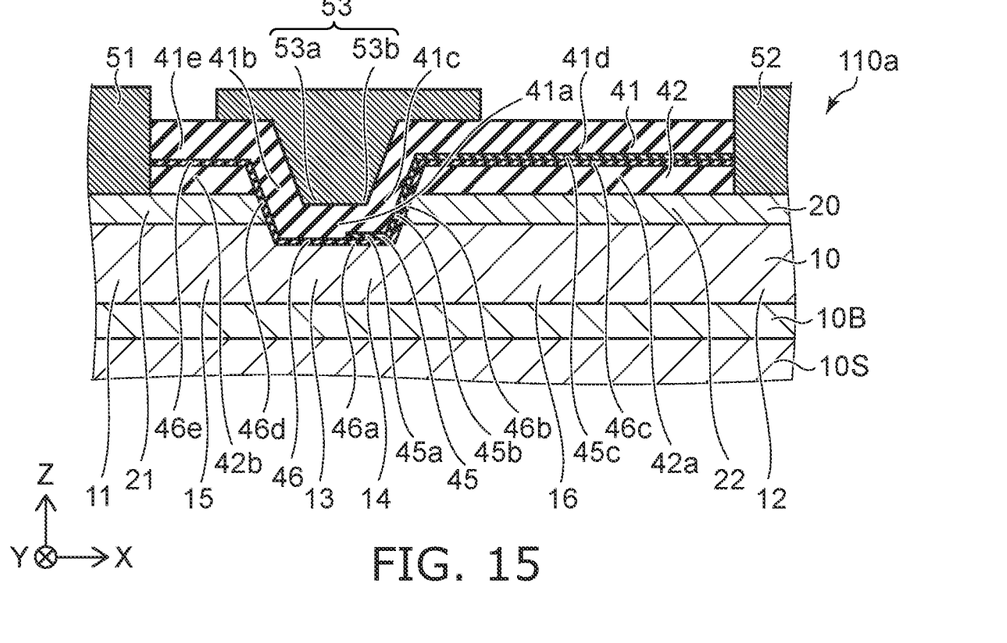
FIG. 15 is a schematic cross-sectional view illustrating a semiconductor device according to a fourth embodiment.
Figure 16:
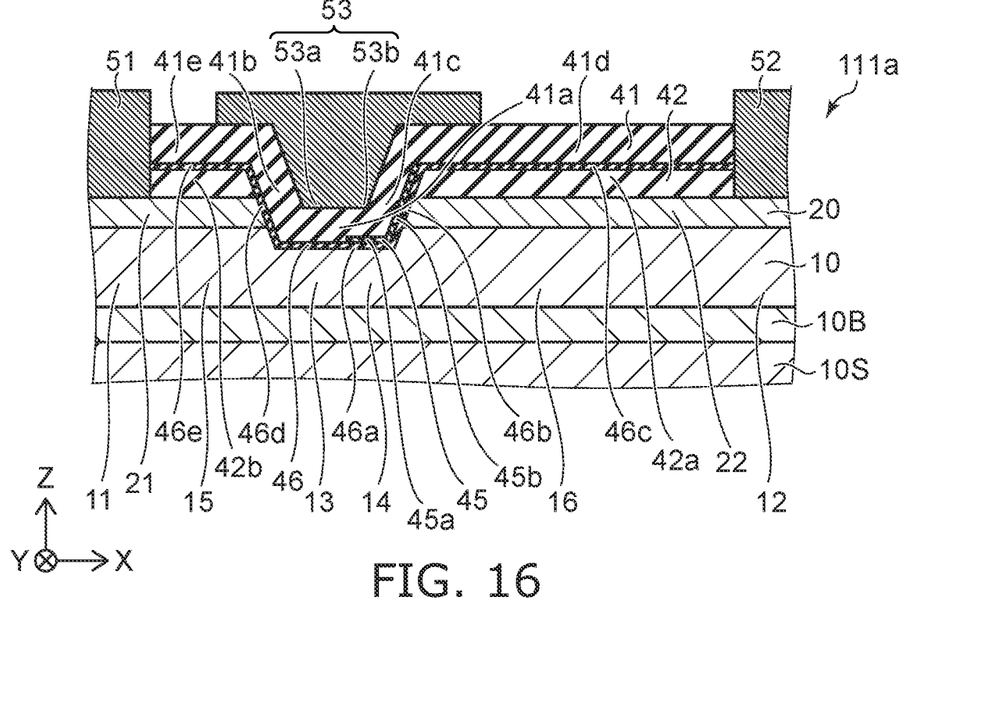
FIG. 16 is a schematic cross-sectional view illustrating a semiconductor device according to the fourth embodiment.
Figure 17:
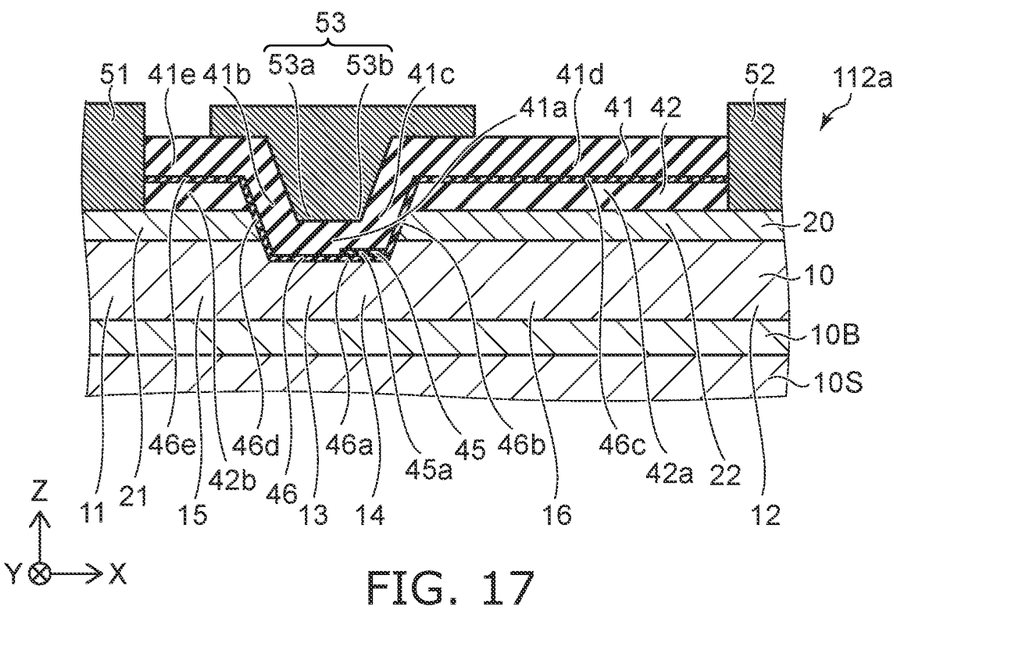
FIG. 17 is a schematic cross-sectional view illustrating a semiconductor device according to the fourth embodiment.

FIGS. 15 to 17 are schematic cross-sectional views illustrating semiconductor devices according to the fourth embodiment.

As shown in FIGS. 15 to 17, the semiconductor devices 110a, 111a and 112a include the nitride member 46. Except for this, the configurations of the semiconductor devices 110a, 111a and 112a may be the same as the configurations of the semiconductor devices 110, 111 and 112. By providing the nitride region 46, for example, high electron mobility can be easily obtained at the bottom of the recess and the side of the recess. The nitride region 46 suppresses the intrusion of impurities, for example. High reliability is easy to obtain.

In the examples of FIGS. 12 to 17, the first member 45 may be $Al_{z1}Ga_{1-z1}N$ ($0 \leq z1 < 1$). The first member 45 may include, for example, GaN. On the other hand, the nitride member 46 includes $Al_{z2}Ga_{1-z2}N$ ($0 < z2 \leq 1$, $x2 < z2$). The nitride member 46 may be, for example, AlN.

The embodiment may include the following configurations.

Configuration 1

A semiconductor device, comprising:
a first electrode;
a second electrode, a direction from the first electrode to the second electrode being along a first direction;
a third electrode, a position of the third electrode in the first direction being between a position of the first electrode in the first direction and a position of the second electrode in the first direction;
a first semiconductor layer including $Al_{x1}Ga_{1-x1}N$ ($0 \leq x1 < 1$), the first semiconductor layer including a first partial region, a second partial region, a third partial region, a fourth partial region, a fifth partial region, and a sixth partial region, a direction from the first partial region to the first electrode, a direction from the second partial region to the second electrode, a direction from the third partial region to a part of the third electrode, and a direction from the fourth partial region to an other part of the third electrode being along a second direction crossing the first direction, the fourth partial region being between the third partial region and the second partial region, a position of the fifth partial region in the first direction being between the position of the first partial region in the first direction and a position of the third partial region in the first direction, a position of the sixth partial region in the first direction being between the position of the fourth partial region in the first direction and the position of the second partial region in the first direction;

a second semiconductor layer including $Al_{x2}Ga_{1-x2}N$ ($0 < x2 \leq 1$, $x1 < x2$), the second semiconductor layer including a first semiconductor portion and a second semiconductor portion, a direction from the fifth partial region to the first semiconductor portion being along the second direction, a direction from the sixth partial region to the second semiconductor portion being along the second direction;

a first insulating member including a first insulating region and including a first material, the first insulating region being between the third partial region and the part of the third electrode in the second direction and between the fourth partial region and the other part of the third electrode in the second direction, the first insulating region contacting the third partial region and the part of the third electrode; and a first member including a first portion and including a second material different from the first material, the first portion being between the fourth partial region and the other part of the third electrode.

Configuration 2

The semiconductor device according to Configuration 1, wherein
the first material includes silicon and oxygen,
the second material includes at least one of a third material, a fourth material or a fifth material,
the third material includes aluminum and nitrogen,
the fourth material includes silicon and nitrogen, and
the fifth material includes at least one selected from the group consisting of aluminum and silicon, and at least one selected from the group consisting of nitrogen and oxygen.

Configuration 3

The semiconductor device according to Configuration 1, wherein
the first material includes silicon and oxygen, and
the second material includes aluminum and nitrogen, Configuration 4

A semiconductor device, comprising:
a first electrode;
a second electrode, a direction from the first electrode to the second electrode being along a first direction;
a third electrode, a position of the third electrode in the first direction being between a position of the first electrode in the first direction and a position of the second electrode in the first direction;
a first semiconductor layer including $Al_{x1}Ga_{1-x1}N$ ($0 \leq x1 < 1$), the first semiconductor layer including a first partial region, a second partial region, a third partial region, a fourth partial region, a fifth partial region, and a sixth partial region, a direction from the first partial region to the first electrode, a direction from the second partial region to the second electrode, a direction from the third partial region to a part of the third electrode, and a direction from the fourth partial region to an other part of the third electrode being along a second direction crossing the first direction, the fourth partial region being between the third partial region and the second partial region, a position of the fifth partial region in the first direction being between the position of the first partial region in the first direction and a position of the third partial region in the first direction, a position of the sixth partial region in the first direction being between the position of the fourth partial region in the first direction and the position of the second partial region in the first direction;
a second semiconductor layer including $Al_{x2}Ga_{1-x2}N$ ($0 < x2 \leq 1$, $x1 < x2$), the second semiconductor layer including a first semiconductor portion and a second semiconductor portion, a direction from the fifth partial region to the first semiconductor portion being along the second direction, a direction from the sixth partial region to the second semiconductor portion being along the second direction;

a first insulating member including a first insulating region, the first insulating region being between the third partial region and the part of the third electrode in the second direction and between the fourth partial region and the other part of the third electrode in the second direction, the first insulating region contacting the third partial region and the part of the third electrode; and a first member including a first portion, the first portion being between the fourth partial region and the other part of the third electrode, the first insulating region having one of a compressive stress and a tensile stress, the first portion having other one of a compressive stress and a tensile stress.

Configuration 5

The semiconductor device according to any one of Configurations 1 to 4, wherein at least a part of the third electrode is between the fifth partial region and the sixth partial region in the first direction.

Configuration 6

The semiconductor device according to any one of Configurations 1 to 4, wherein at least a part of the third electrode is between the first semiconductor portion and the second semiconductor portion in the first direction.

Configuration 7

The semiconductor device according to Configuration 6, wherein the first insulating member includes a second insulating region and a third insulating region, the second insulating region is between the first semiconductor portion and the third electrode in the first direction, and the third insulating region is between the third electrode and the second semiconductor portion in the first direction.

Configuration 8

The semiconductor device according to Configuration 7, wherein the first member further includes a second portion, and the second portion is between the third insulating region and the second semiconductor portion, Configuration 9

The semiconductor device according to Configuration 8, wherein the second portion contacts the first portion.

Configuration 10

The semiconductor device according to any one of Configurations 1 to 9, wherein the first member further includes a third portion, and the second semiconductor portion is between the sixth partial portion and the third portion Configuration 11

The semiconductor device according to Configuration 10, wherein the first insulating member includes a fourth insulating region, and the third portion is between the second semiconductor portion and the fourth insulating region.

Configuration 12

The semiconductor device according to Configuration 11, further comprising:

a second insulating member including silicon and nitrogen, the second insulating member including a first insulating portion, and the first insulating portion being between the second semiconductor portion and the third portion.

Configuration 13

The semiconductor device according to Configuration 12, wherein the first insulating member includes a fifth insulating region, and the first semiconductor portion is provided between the fifth partial region and the fifth insulating region.

Configuration 14

The semiconductor device according to Configuration 13, wherein the second insulating member includes a second insulating portion, and the second insulating portion is between the first semiconductor portion and the fifth insulating region.

Configuration 15

The semiconductor device according to any one of Configurations 1 to 14, wherein a distance between the first electrode and the third electrode along the first direction is shorter than a distance between the third electrode and the second electrode along the first direction.

Configuration 16

The semiconductor device according to any one of Configurations 1 to 15, wherein a thickness of the first portion along the second direction is not less than 0.2 nm and not more than 5 nm.

Configuration 17

The semiconductor device according to any one of Configurations 1 to 16, wherein the first portion is between the first semiconductor layer and an end portion of the first insulating region on a side of the second electrode.

Configuration 18

The semiconductor device according to any one of Configurations 1 to 17, wherein a length of the first portion along the first direction is not less than 0.05 times and not more than 0.9 times a length of the first insulating region along the first direction.

Configuration 19

The semiconductor device according to any one of Configurations 1 to 18, wherein the first semiconductor layer includes a crystal, and at least a part of the first member includes a crystal.

Configuration 20

The semiconductor device according to any one of Configurations 1 to 19, wherein the x1 is not less than 0 and not more than 0.05, and the x2 is more than 0.05 and is not more than 0.8.

In the embodiment, the second material may include a sixth material. The sixth material includes indium and nitrogen. The sixth material includes, for example, $In_{y1}Al_{y2}Ga_{1-y1-y2}N$ ($0<y1\leq1$, $0\leq y2\leq1$, $y1+y2\leq1$). For example, the sixth material may include $In_{y1}Ga_{1-y1}N$ ($0<y1\leq1$). As a result, the on-resistance can be lowered. For example, a high threshold is obtained and a low on-resistance is obtained. A semiconductor device capable of improving characteristics is provided. Thus, the second material may include at least one of the third material, the fourth material, the fifth material, or the sixth material.

According to the embodiment, it is possible to provide a semiconductor device having improved characteristics.

In the specification, "nitride semiconductor" includes all compositions of semiconductors of the chemical formula $B_xIn_yAl_zGa_{1-x-y-z}N$ ($0\leq x\leq1$, $0\leq y\leq1$, $0\leq z\leq1$, and $x+y+z\leq1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating members, etc,, from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode to the second electrode being along a first direction;
a third electrode, a position of the third electrode in the first direction being between a position of the first electrode in the first direction and a position of the second electrode in the first direction;
a first semiconductor layer including $Al_{x1}Ga_{1-x1}N$ ($0 \le x1 < 1$), the first semiconductor layer including a first partial region, a second partial region, a third partial region, a fourth partial region, a fifth partial region, and a sixth partial region, a direction from the first partial region to the first electrode, a direction from the second partial region to the second electrode, a direction from the third partial region to a part of the third electrode, and a direction from the fourth partial region to an other part of the third electrode being along a second direction crossing the first direction, the fourth partial region being between the third partial region and the second partial region, a position of the fifth partial region in the first direction being between the position of the first partial region in the first direction and a position of the third partial region in the first direction, a position of the sixth partial region in the first direction being between the position of the fourth partial region in the first direction and the position of the second partial region in the first direction;
a second semiconductor layer including $Al_{x2}Ga_{1-x2}N$ ($0 < x2 \le 1$, $x1 < x2$), the second semiconductor layer including a first semiconductor portion and a second semiconductor portion, a direction from the fifth partial region to the first semiconductor portion being along the second direction, a direction from the sixth partial region to the second semiconductor portion being along the second direction;
a first insulating member including a first insulating region, the first insulating region being between the third partial region and the part of the third electrode in the second direction and between the fourth partial region and the other part of the third electrode in the second direction, the first insulating region physically contacting the third partial region and the part of the third electrode; and
a first member including $Al_{z1}Ga_{1-z1}N$ ($0 < z1 \le 1$, $x1 < z1$), the first member including a first portion, the first portion being between the fourth partial region and the other part of the third electrode in the second direction,
wherein
at least a part of the third electrode is between the first semiconductor portion and the second semiconductor portion in the first direction,
the first insulating member includes a second insulating region,
the second insulating region is between the first semiconductor portion and the third electrode in the first direction, and
the second insulating region physically contacts the third partial region, the fifth partial region, the first semiconductor portion, and the part of the third electrode.

2. The device according to claim 1, wherein
the first member further includes a third portion, and
the second semiconductor portion is between the sixth partial region and the third portion.

3. The device according to claim 2, wherein
the first insulating member includes a fourth insulating region, and
the third portion is between the second semiconductor portion and the fourth insulating region.

4. The device according to claim 3, further comprising:
a second insulating member including silicon and nitrogen,
the second insulating member including a first insulating portion, and
the first insulating portion being between the second semiconductor portion and the third portion.

5. The device according to claim 4, wherein
the first insulating member includes a fifth insulating region, and
the first semiconductor portion is provided between the fifth partial region and the fifth insulating region.

6. The device according to claim 5, wherein
the second insulating member includes a second insulating portion, and
the second insulating portion is between the first semiconductor portion and the fifth insulating region.

7. The device according to claim 2, further comprising:
a nitride member including $Al_{z2}Ga_{1-z2}N$ ($0 < z2 \le 1$, $x2 < z2$), at least a part of the nitride member is between the second semiconductor portion and the third portion in the second direction.

8. The device according to claim 1, wherein
the first insulating member includes a third insulating region, and
the third insulating region is between the third electrode and the second semiconductor portion in the first direction.

9. The device according to claim 8, wherein
the first member further includes a second portion, and
the second portion is between the third insulating region and the second semiconductor portion.

10. The device according to claim 9, wherein
the second portion contacts the first portion.

11. The device according to claim 9, further comprising:
a nitride member including $Al_{z2}Ga_{1-z2}N$ ($0<z2\leq1$, $x2<z2$),
at least a part of the nitride member is between the second portion and the second semiconductor portion in the first direction.

12. The device according to claim 1, wherein the z1 is less than the x2.

13. The device according to claim 1, wherein
at a part of the first insulating region is between the fifth partial region and the sixth partial region in the first direction.

14. The device according to claim 1, further comprising:
a nitride member including $Al_{z2}Ga_{1-z2}N$ ($0<z2\leq1$, $x2<z2$),
the nitride member including a first nitride region, and
at least a part of the first nitride region is between the third partial region and a part of the first insulating region, and between the fourth partial region and the first portion.

15. The device according to claim 1, wherein
no member including the $Al_{z1}Ga_{1-z1}N$ is provided in between the third partial region and the part of the third electrode, and between the fifth partial region and the part of the third electrode, and between the first semiconductor portion and the part of the third electrode.

16. A semiconductor device, comprising:
a first electrode;
a second electrode, a direction from the first electrode to the second electrode being along a first direction;
a third electrode, a position of the third electrode in the first direction being between a position of the first electrode in the first direction and a position of the second electrode in the first direction;
a first semiconductor layer including $Al_{x1}Ga_{1-x1}N$ ($0\leq x<1$), the first semiconductor layer including a first partial region, a second partial region, a third partial region, a fourth partial region, a fifth partial region, and a sixth partial region, a direction from the first partial region to the first electrode, a direction from the second partial region to the second electrode, a direction from the third partial region to a part of the third electrode, and a direction from the fourth partial region to an other part of the third electrode being along a second direction crossing the first direction, the fourth partial region being between the third partial region and the second partial region, a position of the fifth partial region in the first direction being between the position of the first partial region in the first direction and a position of the third partial region in the first direction, a position of the sixth partial region in the first direction being between the position of the fourth partial region in the first direction and the position of the second partial region in the first direction;
a second semiconductor layer including $Al_{x2}Ga_{1-x2}N$ ($0<x2\leq1$, $x1<x2$), the second semiconductor layer including a first semiconductor portion and a second semiconductor portion, a direction from the fifth partial region to the first semiconductor portion being along the second direction, a direction from the sixth partial region to the second semiconductor portion being along the second direction;
a first insulating member including a first insulating region, the first insulating region being between the third partial region and the part of the third electrode in the second direction and between the fourth partial region and the other part of the third electrode in the second direction, the first insulating region contacting the third partial region and the part of the third electrode;
a first member including $Al_{z1}Ga_{1-z1}N$ ($0\leq z1\leq1$), the first member including a first portion, the first portion being between the fourth partial region and the other part of the third electrode; and
a nitride member including $Al_{z2}Ga_{1-z2}N$ ($0<z2\leq1$, $x2<z2$), the nitride member including a first nitride region, at least a part of the first nitride region being between the third partial region and a part of the first insulating region in the second direction, and at least another part of the first nitride region being between the fourth partial region and the first portion in the second direction, the part of the first nitride region physically contacting the third partial region and the part of the first insulating region,
wherein
at least a part of the third electrode is between the first semiconductor portion and the second semiconductor portion in the first direction,
the first insulating member further includes a second insulating region,
the second insulating region is between the first semiconductor portion and the third electrode in the first direction,
the nitride member includes a fourth nitride region,
at least a part of the fourth nitride region is between the first semiconductor portion and the second insulating region in the first direction, and
the fourth nitride region physically contacts the fifth partial region, the first semiconductor portion, the part of the first insulating region, and the second insulating region.

17. The device according to claim 16, wherein
no member including the $Al_{z1}Ga_{1-z1}N$ is provided in between the third partial region and the part of the first insulating region, between the fifth partial region and the second insulating region, between the first semiconductor portion and the second insulating region, and between the fifth partial region and the part of the first insulating region.

* * * * *